Figure 1:
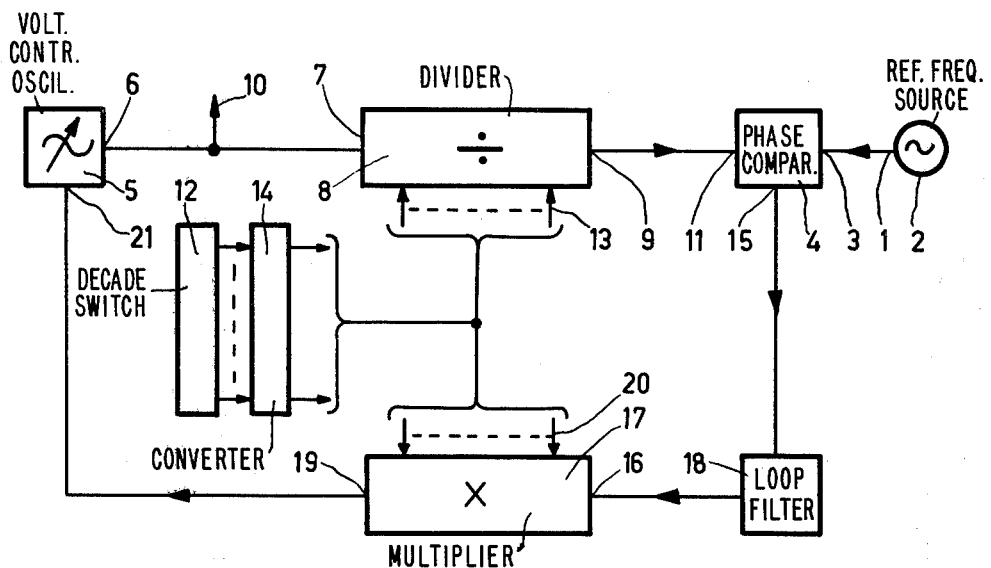

United States Patent [19]

Underhill et al.

[11] 4,024,464

[45] May 17, 1977

[54] FREQUENCY SYNTHESIZER OF THE PHASE LOCK LOOP TYPE

[75] Inventors: Michael James Underhill; Peter Anthony Jordan, both of Crawley, England

[73] Assignee: U.S. Philips Corporation, New York, N.Y.

[22] Filed: Nov. 19, 1975

[21] Appl. No.: 633,217

[30] Foreign Application Priority Data

Dec. 12, 1974 United Kingdom ............. 53792/74

[52] U.S. Cl. .................................. 331/10; 331/17; 331/25
[51] Int. Cl.² ......................................... H03B 3/04
[58] Field of Search .................... 331/10, 17, 18, 25

[56] References Cited

UNITED STATES PATENTS

| | | | |
|---|---|---|---|
| 3,337,814 | 8/1967 | Brase et al. | 331/18 |
| 3,413,565 | 11/1968 | Babany et al. | 331/18 |
| 3,551,826 | 12/1970 | Sepe | 331/25 X |
| 3,729,688 | 4/1973 | Cerny, Jr. et al. | 331/17 X |

*Primary Examiner*—Siegfried H. Grimm
*Attorney, Agent, or Firm*—Frank R. Trifari; George B. Berka

[57] ABSTRACT

A frequency synthesizer of the phase lock loop type including a reference frequency source, a voltage-controlled oscillator and a frequency divider connected to the oscillator output to divide the output frequency by a selectively-variable integer N. The outputs of the frequency divider and the reference frequency source are applied to a phase comparator which has an output connected to a filter. The filter output is applied through a multiplier, having a multiplication factor $n$ proportional to N, to the input of the voltage controlled oscillator. The frequency divider and the multiplier are controlled by the same control means in order to keep the loop gain constant, irrespective of the amount of change in N.

5 Claims, 2 Drawing Figures

FREQUENCY SYNTHESIZER OF THE PHASE LOCK LOOP TYPE

THIS INVENTION relates to fequency synthesisers and more particularly to frequency synthesisers of the phase lock loop type including a reference frequency source, a voltage-controlled oscillator (VCO) the output frequency of which forms the synthesiser output, a frequency divider connected to the VCO output and which divides said output frequency by a selectively-variable integer N, control means for setting the value of N in the divider, a phase comparator having a first input connected to the output of the divider and a second input connected to the reference frequency source, a loop filter interposed between the output of the comparator and the voltage control input of the VCO so that the said output frequency is controlled at the $N^{th}$ multiple of the reference frequency.

Such frequency synthesisers, hereinafter referred to as being of the type described, are known and are described, for example, in V. F. Kroupa, "Frequency Synthesisers", Griffin, London 1973.

The division factor N of the divider is selectable, for example by the operation of appropriate decade switches, to be any integer in a given range, for example 1 to 100. Thus if the reference frequency is 100 kHz, the output frequency of the synthesiser can cover the frequency range 100 kHz to 10 MHz in 100 kHz steps. The reference frequency is generally provided from a stable frequency source, such as a crystal-controlled oscillator, either directly or by division. In the latter case, the division factor is generally made variable, so allowing the step size of the output frequency to be varied. The loop filter forms part of the phase lock loop and is either of the active or passive type.

In order to cater for frequency differences between the output of the N-divider and the reference frequency, the phase comparator is generally arranged to compare the input signal phases with respect to time so that the average level of the output signal depends upon the phase and frequency difference between the comparator input signals.

It is well-known in the art that the design of phase lock loop systems is a compromise between speed of response (capture time) and the suppression of spurious frequencies ('noise') in the VCO output. Thus for any particular synthesiser there is an optimum design, i.e., a design which gives minimum capture time with the degree of suppression required. It is normal practice to design the loop filter to give the required noise suppression and then to adjust the loop damping factor to give minimum capture time. The damping factor is, inter alia, a function of the loop gain; so any variation of the loop gain affects the operation adversely. Once the design has been optimised, an increase of loop gain K tends to make the circuit unstable (i.e., a tendency to oscillation at one or more frequencies dependent upon the phase shift of the loop filter) with a resultant increase in capture time, and a reduction of loop gain K increases the capture time Tc (since Tc $\alpha 1/K$).

With synthesiser of the type described, an N-divider is included in the loop and, since loop gain is inversely proportional to N, capture time has to be sacrificed in order to maintain circuit stability with change of N over its range. If N is greater than ten, the design becomes particularly difficult and the capture time becomes unduly long (Tc $\alpha$N).

The object of the invention is to mitigate these disadvantages in synthesisers of the type described.

According to one aspect of the present invention there is provided a frequency synthesiser of the type described wherein the output of the filter is connected to the VCO via a multiplier having a multiplication factor $n$ which is proportional to N and which is controlled by said control means.

The loop gain K is now proportional to n/N and, since n/N is constant, K is constant irrespective of the value of N. The design constraints imposed by the range of values of N are thus substantially removed and N may, for example, now have a range of 1 to 1,000. Since the synthesiser now operates with constant loop gain irrespective of the value of N, the loop design can be optimised in terms of capture-time/noise-performance; so enabling the capture time to be reduced and/or the noise suppression increased.

According to a further aspect of the present invention, there is provided a frequency synthesiser of the type described including an $n$-multiplier controlled by the control means such that $n$ is proportional to N, said multiplier being located between the filter output and the VCO input, and further including a voltage adder for adding a preset voltage to the input of the VCO whereby a predictive voltage dependent upon the value of N is applied to the control input of the VCO.

By arranging the preset voltage to be equal in magnitude and opposite in sign to the so-called offset voltage of the VCO, the output frequency of the VCO is then directly proportional to the input voltage. The offset voltage of a VCO is defined as the equivalent zero-fequency voltage, i.e., the input voltage which, in theory, would give a zero output frequency; the value of this voltage being obtained by extending the linear frequency/voltage characteristic slope of the VCO to the zero frequency point. Due to the presence of the $n$-multiplier and to the direct proportionality now achieved between the voltage input and the frequency output of the VCO, the input voltage to the $n$-multiplier is always the same in the stable state of the loop, irrespective of the value of N (and hence of $n$). Thus, when the value of N is changed, the loop substantially remains in the stable state and only needs to correct for minor inaccuracies in the system, such as, for example, slight inaccuracies in the linearity of the VCO frequency/voltage characteristic slope. Thus the phase lock loop relocks very rapidly indeed when N is changed, irrespective of the amount by which N is changed. If, for example, the frequency/voltage slope of the VCO is only linearly accurate within 1%, then the input voltage of the VCO is immediately switched to a value which gives an output frequency within 1% of the required frequency. The phase lock loop therefore only has to cater for a 1% frequency error under the most adverse conditions, irrespective of the amount of change in N.

Figure 2:
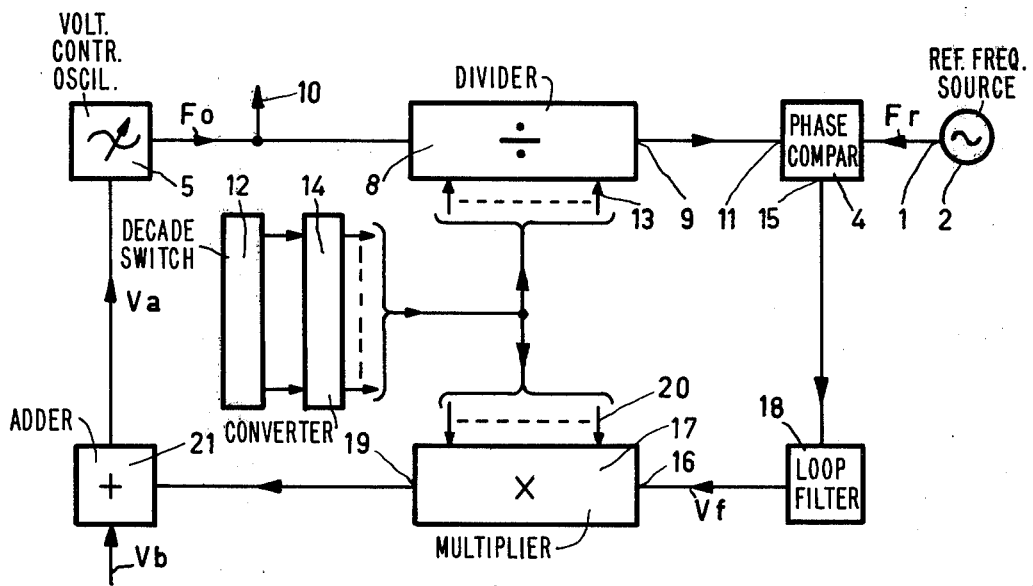

Embodiments of the invention will now be described by way of example with reference to the accompanying drawing, of which:

FIG. 1 shows a block schematic circuit of an embodiment of a frequency synthesiser according to the first aspect of the invention and FIG. 2 shows a block schematic circuit of an embodiment of a frequency synthesiser according to the further aspect of the invention.

In FIG. 1, the output 1 of a reference frequency source 2 is connected to a first input 3 of a phase comparator 4. The output 6 of a VCO 5 is connected to the circuit output 10 and to the input 7 of a controlled divide-by-N divider 8, the output 9 of which is connected to a second input 11 of a comparator 4. One or more, typically three, manually-operable decade switches 12 are connected to division factor control inputs 13 of divider 8 via a decimal-to-binary converter 14. The output 15 of phase comparator 4 is connected to the input 16 of a multiplier 17 via a loop filter 18. Multiplier 17 has a voltage multiplication factor $n = N/R$ where R is a constant scaling factor and N is adjustable at the inputs 20 by the outputs of converter 14. The output 19 of multiplier 17 is connected to the voltage control input 21 of VCO 5.

If the multiplier 17 were omitted and the output of loop filter 18 were connected directly to input 21 of VCO 5, a known frequency synthesiser of the type described would be provided; referenced items 2, 4, 5, 8, 12, 14, and 18 all being known per se in such synthesisers.

Since $n/N$ is constant ($=R$), the loop gain of the phase lock loop remains unchanged irrespective of changes in N, since the gain is proportional to $n/N$. Thus the loop gain is independent of the output frequency. Multiplier 17 comprises a multiplying digital-to-analogue converter having an output voltage which is a linear product of a digital word at inputs 20 and an analogue input voltage at input 16. In the practical embodiment an integrated circuit Type No. MC1506L (Motorola Semiconductor Products Inc.) was used in its multiplying mode. A complete circuit schematic of this device is given in the "Motorola Semiconductor Data Book" together with Application Notes concerning the multiplying mode.

Phase comparator 4 may be of any know type suitable for use in phase lock loop type synthesisers but, for reasons, explained hereinafter is preferably of the type described in our co-pending Application Ser. No. 613,814, filed Sept. 16, 1975.

VCO 5 may be any of the know types suitable for this purpose but is preferably of the type that can cover a wide frequency band ratio (e.g. 1000:1) with a substantially linear transfer characteristic. A suitable multivibrator-type VCO is described, for example, "Improved Crosscoupled multivibrator Controllable in Frequency over a Wide Range, "Electronics Letters", Vol. 7, No. 8, pages 180–182, 22nd April 1971. A gyrator-controlled oscillator could alternatively be used; such an oscillator is described, for example, in "Ideal Frequency Modulator," J. O. Voorman, "Electronic Letters," 17th September 1974, Vol. 10, No. 18. Divider 8 is well-known and is commercially available in integrated circuit form. In the practical embodiment, a divider Type MC10136 (Motorola Semiconductor Products Inc.) was used.

FIG. 2 shows a further embodiment of a frequency synthesiser according to the invention, in which figure items having the same, or substantially the same, function as corresponding items of FIG. 1 are given the same reference numerals. The additional item in FIG. 2 is a voltage adder 21 interposed between the loop filter 18 and multiplier 17, which adder adds a voltage Vb to the output voltage of multiplier 17.

Voltage and frequency references are given in FIG. 2 as follows:

Fo is the frequency of VCO 5; Fr is the reference frequency applied at input 3; Vf is the output signal voltage of loop filter 18, and Va is the output voltage of adder 21. The slope of the frequency/voltage transfer characteristic of VCO 5 is assumed to be A and the offset voltage (as hereinbefore defined) of VCO 5 is assumed to be Vo. The multiplication factor $n$ of multiplier 17 is assumed to be N/R. Then:

$$Fo = NFr = A.Va$$

$$Va = Vb + Vf.N/R$$

therefore $$Fo = A \,[Vb + Vo + Vf.N/R]$$

With the loop balanced (locked), Vf settles to a constant value Vm, i.e.:

$$Fo = NFr = A \,[Vb + Vo + Vm.N/R]$$

This equation is satisfied for all values of N if $Vb = -Vo$ and $Fr = A.Vm/R$. Hence Vb may be used as a preset adjustment to cancel Vo. Given correct adjustment of Vb, the value of Vf at balance remains constant at Vm, independent of the value of N. Hence, when N is changed, the circuit does not go out of balance; the necessary change in Va being achieved by multiplier 17 as a function of N without any change of Vf except that required to correct small errors. Vb may be obtained, for example, from a preset potentiometer connected across a constant voltage source. Adder 21 is well-known per se. Switches 12 and converter 14 may, of course, be replaced by any alternative means for providing a programmable input to divider 8 and multiplier 17.

The comparator described and claimed in our aforementioned co-pending Application Ser. No. 613,814 is particularly suited for use in the embodiment shown in FIG. 2 since that comparator gives zero reference frequency ripple in the centre of its range. In this case, the loop is so designed that Vm corresponds with this zero-ripple point. Ripple cancellation considerably eases the design constraints on the loop filter so that either a slightly faster loop response can be obtained or the undesirable frequency modulator ripple sidebands on Fo can be better suppressed.

What we claim is:

1. A frequency synthesiser of the phase lock loop type including a reference frequency source, a voltage-controlled oscillator (VCO) the output frequency of which forms the synthesiser output, a frequency divider connected to the VCO output, which divider is arranged to divide the said output frequency by a selectively-variable integer N, control means for setting the value of N in said divider, a phase comparator having a first input connected to the output of the divider and a second input connected to the reference frequency source, a loop filter interposed between the output of the comparator and the control voltage input of the VCO so that said output frequency is controlled at the $N^{th}$ multiple of the reference frequency; wherein the output of the filter is connected to the VCO input via a multiplier having a multiplication factor $n$ which is proportional to N and which is controlled by said conrol means.

2. A frequency synthesiser of the phase lock loop type including a reference frequency source, a voltage-controlled oscillator (VCO) the output frequency of which forms the synthesiser output, a frequency divider connected to the VCO output, which divider is arranged to divide the said output frequency by a selectively-variable integer N, control means for setting the value of N in said divider, a phase comparator having a first input connected to the output of the divider and a second input connected to the reference frequency source, a loop filter interposed between the output of the comparator and the control voltage input of the VCO so that said output frequency is controlled at the $N^{th}$ multiple of the reference frequency; wherein the synthesiser includes an $n$-multiplier controlled by the control means such that $n$ is proportional to N, said multiplier being located between the filter output and the VCO input, and further including a voltage adder for adding a preset voltage to the input voltage of the VCO from the $n$-multiplier such that, through the action of the feedback path comprising the VCO, the divider, the phase comparator and the filter, the voltage at the input of the $n$-multiplier becomes such that on a change of the value of N a predictive voltage dependent upon said change is applied to the input of the VCO.

3. A frequency synthesiser according to claim 2, wherein the said preset voltage is equal in magnitude and opposite in sign to the offset voltage of the VCO.

4. A frequency synthesiser according to claim 2, wherein the $n$-multiplier is a digital-to-analogue converter used in the multiplying mode.

5. A frequency synthesiser according to claim 2, wherein said control means comprises one or more decade switches connected to a decimal-to-binary converter, the output of the converter being connected to respective inputs of the divider and of the $n$-multiplier.

* * * * *